(12) United States Patent
Inoue et al.

(10) Patent No.: US 9,567,453 B2
(45) Date of Patent: Feb. 14, 2017

(54) FINISHING AGENT FOR TRIVALENT CHROMIUM CHEMICAL CONVERSION COATING FILM, AND METHOD FOR FINISHING BLACK TRIVALENT CHROMIUM CHEMICAL CONVERSION COATING FILM

(75) Inventors: Manabu Inoue, Tokyo (JP); Takashi Koike, Ageo (JP); Ryuta Kashio, Funabashi (JP)

(73) Assignee: DIPSOL CHEMICALS CO., LTD., Tokyo (JP)

( * ) Notice: Subject to any disclaimer, the term of this patent is extended or adjusted under 35 U.S.C. 154(b) by 114 days.

(21) Appl. No.: 14/008,362

(22) PCT Filed: Mar. 30, 2012

(86) PCT No.: PCT/JP2012/058561
§ 371 (c)(1),
(2), (4) Date: Sep. 27, 2013

(87) PCT Pub. No.: WO2012/137680
PCT Pub. Date: Oct. 11, 2012

(65) Prior Publication Data
US 2014/0017514 A1    Jan. 16, 2014

(30) Foreign Application Priority Data
Apr. 1, 2011   (JP) .................................. 2011-081758

(51) Int. Cl.
| C08K 5/00 | (2006.01) |
| C08K 13/02 | (2006.01) |
| C08K 5/405 | (2006.01) |
| C08K 5/21 | (2006.01) |
| C23C 22/17 | (2006.01) |
| C23C 22/20 | (2006.01) |
| C23C 22/68 | (2006.01) |
| C23C 16/56 | (2006.01) |
| C23C 22/47 | (2006.01) |
| C23C 22/83 | (2006.01) |

(52) U.S. Cl.
CPC ............. *C08K 13/02* (2013.01); *C08K 5/21* (2013.01); *C08K 5/405* (2013.01); *C23C 16/56* (2013.01); *C23C 22/17* (2013.01); *C23C 22/20* (2013.01); *C23C 22/47* (2013.01); *C23C 22/68* (2013.01); *C23C 22/83* (2013.01); *C23C 2222/10* (2013.01); *Y10T 428/12778* (2015.01)

(58) Field of Classification Search
CPC .................................. C08K 5/21; C08K 5/405
See application file for complete search history.

(56) References Cited

U.S. PATENT DOCUMENTS

| 5,415,702 A | 5/1995 | Bishop et al. |
| 2003/0121570 A1 | 7/2003 | Oshima et al. |
| 2003/0148122 A1 | 8/2003 | Oshima et al. |
| 2003/0213533 A1 | 11/2003 | Sako et al. |
| 2005/0103403 A1 | 5/2005 | Oshima et al. |
| 2009/0280253 A1 | 11/2009 | Church |
| 2010/0180793 A1* | 7/2010 | Dingwerth ............. C23C 22/83 106/14.41 |
| 2010/0230009 A1 | 9/2010 | Oshima et al. |
| 2011/0159315 A1 | 6/2011 | Saito et al. |

FOREIGN PATENT DOCUMENTS

| CA | 2765961 | 1/2011 |
| CN | 100335575 C | 9/2007 |
| JP | 2001-009362 A | 1/2001 |
| JP | 2003-166074 A | 6/2003 |
| JP | 2003-166075 A | 6/2003 |
| JP | 2004-093784 A | 3/2004 |
| JP | 2005-023372 A | 1/2005 |
| JP | 2007-268387 A | 10/2007 |
| WO | WO-2009/145183 A1 | 12/2009 |

OTHER PUBLICATIONS

International Search Report and Written Opinion dated Jul. 3, 2012 for PCT/JP2012/058561 and English translation.

* cited by examiner

*Primary Examiner* — Peter D Mulcahy
(74) *Attorney, Agent, or Firm* — Daniel Shelton; Foley & Lardner LLP

(57) ABSTRACT

The purpose of the present invention is to provide a water-soluble finishing agent for a trivalent chromium chemical conversion coating film, which has low insulation, no problems with tightening properties, outstanding gloss and high corrosion resistance, and can obtain a trivalent chromium chemical conversion coating film, especially a black trivalent chromium chemical conversion coating film, having few scratches and flaws. The finishing agent for a trivalent chromium chemical conversion coating film is characterized by containing a trivalent chromium source, a phosphate ion source, a zinc ion source, a chelating agent which can form a complex with trivalent chromium, and a non-ionic water-soluble polymer compound selected from a group comprising poly(vinyl alcohol) and derivatives thereof, poly(vinyl pyrrolidone) and derivatives thereof, poly(alkylene glycol)s and derivatives thereof, and cellulose ethers and derivatives thereof.

14 Claims, No Drawings

FINISHING AGENT FOR TRIVALENT CHROMIUM CHEMICAL CONVERSION COATING FILM, AND METHOD FOR FINISHING BLACK TRIVALENT CHROMIUM CHEMICAL CONVERSION COATING FILM

CROSS-REFERENCE TO RELATED APPLICATIONS

This application is a national stage application under 35 U.S.C. §371 of International Application No. PCT/JP2012/058561, filed on Mar. 30, 2012, which claims the benefit to Japanese Application 2011-081758, filed on Apr. 1, 2011, each of which is incorporated herein by reference in its entirety.

TECHNICAL FIELD

The present invention relates to a finishing agent for a trivalent chromium chemical conversion coating film, and particularly to a finishing agent for forming a hexavalent chromium-free corrosion resistance film having less scratches and stains as well as excellent gloss and corrosion resistance, a finishing method using the same, and a metal article having a hexavalent chromium-free corrosion resistant film.

BACKGROUND ART

In recent years, zinc or zinc alloy-plating has been relatively often used as a method for preventing corrosion of metal surfaces. Plating alone, however, does not provide sufficient corrosion resistance, and thus a treatment with chromic acid, a so-called chromate treatment after the plating has been widely used. The chromate treatment here forms a chromate film using hexavalent chromium as a main component. However, it has recently been pointed out that hexavalent chromium may adversely affect the human body and the environment and there has been a strong trend to restrict the use of hexavalent chromium. Particularly, in the industrial field, alternative techniques to hexavalent chromate have been strongly needed.

Under such circumstances, a method for forming a trivalent chromium chemical conversion coating film has been proposed, which is free from hexavalent chromium (for example, U.S. Pat. No. 5,415,702, Japanese Patent Application Laid-Open (JP-A) No. 2003-166074, JP-A No. 2003-166075). Although having excellent corrosion resistance, a trivalent chromium chemical conversion coating film formed by this method has relatively less glossy appearance than conventional black hexavalent chromate films. In order to obtain higher gloss, the surface of the trivalent chromium chemical conversion coating film had to be overcoated with a thick resin film, silicate film, or the like again. Such overcoating, however, may cause problems with insulation and fastening performance. A treatment with a finishing agent for a trivalent chromium chemical conversion coating film, including a trivalent chromium source, a phosphate ion source, a zinc ion source, and a chelating agent capable of forming a complex with trivalent chromium (for example, JP-A No. 2005-23372) does not cause problems with insulation and fastening performance, but may cause a film formed by this treatment to have problems of many scratches due to the contact of articles, and green stains and white stains due to liquid accumulation or the like in a drying step of the finishing treatment, for example. There sometimes arises a problem of mold being generated in the finishing agent.

SUMMARY OF INVENTION

Technical Problems

An objective of the present invention is to provide a water-soluble finishing agent for a trivalent chromium chemical conversion coating film, which can produces a trivalent chromium chemical conversion coating film, particularly a black trivalent chromium chemical conversion coating film, having low insulation, excellent gloss and high corrosion resistance without any problem with fastening performance, and further having less scratches and stains.

Another object of the present invention is to provide a finishing method in order to obtain the trivalent chromium chemical conversion coating film.

Yet another object of the present invention is to provide a metal article having a hexavalent chromium-free corrosion resistant film.

Solution to Problems

The present invention has been accomplished based on such finding that the foregoing problems can be solved by adhering a finishing agent solution to a substrate having a trivalent chromium chemical conversion coating film to form a finishing layer on the trivalent chromium chemical conversion coating film, in which the finishing agent solution includes: a trivalent chromium source; a phosphate ion source; a zinc ion source; a chelating agent capable of forming a complex with trivalent chromium; and a nonionic water-soluble polymer selected from the group consisting of polyvinyl alcohol and its derivatives, polyvinylpyrrolidone and its derivatives, polyalkylene glycol and its derivatives, and cellulose ether and its derivatives; and/or a stain-blocking agent selected from urea, thiourea, thiourea dioxide, and their derivatives.

The prevent invention provides a finishing agent for a trivalent chromium chemical conversion coating film, including: a trivalent chromium source; a phosphate ion source; a zinc ion source; a chelating agent capable of forming a complex with trivalent chromium; and a nonionic water-soluble polymer selected from the group consisting of polyvinyl alcohol and its derivatives, polyvinylpyrrolidone and its derivatives, polyalkylene glycol and its derivatives, and cellulose ether and its derivatives.

The present invention also provides a finishing agent for a trivalent chromium chemical conversion coating film, including: a trivalent chromium source; a phosphate ion source; a zinc ion source; a chelating agent capable of forming a complex with trivalent chromium; and a stain-blocking agent selected from urea, thiourea, thiourea dioxide, and their derivatives.

The present invention also provides a finishing agent for a trivalent chromium chemical conversion coating film, including: a trivalent chromium source; a phosphate ion source; a zinc ion source; a chelating agent capable of forming a complex with trivalent chromium; the nonionic water-soluble polymer; and the stain-blocking agent.

The present invention also provides a finishing agent for a trivalent chromium chemical conversion coating film, including a trivalent chromium complex, phosphoric acid ions, zinc ions, a nonionic water-soluble polymer and/or a stain-blocking agent, and water, and being in the form of an aqueous solution, in which the nonionic water-soluble polymer is selected from the group consisting of polyvinyl alcohol and its derivatives, polyvinylpyrrolidone and its derivatives, polyalkylene glycol and its derivatives, and cellulose ether and its derivatives, and the stain-blocking agent is selected from urea, thiourea, thiourea dioxide and their derivatives.

The present invention also provides a method for finishing a black trivalent chromium chemical conversion coating film, in which the finishing agent for a trivalent chromium chemical conversion coating film in the form of an aqueous solution is adhered to a black trivalent chromium chemical conversion coating film of a substrate having the black trivalent chromium chemical conversion coating film, followed by drying.

The present invention also provides a metal article having a hexavalent chromium-free corrosion resistant film, including a metal substrate, a black trivalent chromium chemical conversion coating film provided thereon, and a finishing layer provided thereon, in which the finishing layer contains trivalent chromium, zinc, and phosphorus element, specifically contains 10 to 40 parts by weight of trivalent chromium, 20 to 75 parts by weight of zinc, and 3 to 40 parts by weight of phosphorus given that the total of trivalent chromium, zinc, and phosphorus elements is 100 parts by weight.

In order to obtain the trivalent chromium chemical conversion coating film having corrosion resistance and glossy appearance, the barrier film of the trivalent chromium chemical conversion coating film needs to be fine and thick. For the trivalent chromium chemical conversion coating film, however, it is difficult to form the barrier film as thick as that for hexavalent chromate only by the reaction of the chemical conversion coating.

However, according to the present invention, the hexavalent chromium-free corrosion resistant film, particularly the black trivalent chromium chemical conversion coating film, having less scratches, stains, particularly green stains due to liquid accumulation, and low insulation, as well as excellent gloss and corrosion resistance without losing fastening performance can be formed. Accordingly, it can be expected to widely use the present invention in different fields such as electronic devices from now on.

DESCRIPTION OF EMBODIMENTS

The trivalent chromium sources used in the finishing agent for a trivalent chromium film of the present invention include trivalent chromium salts such as chromium chloride, chromium sulfate, chromium nitrate, chromium phosphate, and chromium acetate. Trivalent chromium may be obtained by reducing hexavalent chromium of chromic acid, bichromate, or the like with a reducing agent. These trivalent chromium sources can be used alone or in combination of two or more. The concentration thereof is preferably 0.1 to 20 g/L, and more preferably 0.3 to 10 g/L based on the concentration of chromium.

The phosphate ion sources used in the finishing agent for a trivalent chromium film of the present invention include oxygen acids of phosphorus, such as phosphoric acid and phosphorous acid, and their salts, particularly alkali salts. These phosphate ion sources can be used alone or in combination of two or more. The concentration thereof is preferably 0.3 to 70 g/L, and more preferably 1 to 40 g/L.

In the present invention, chromium phosphate can be used as the trivalent chromium source and the phosphate ion source. Chromium phosphate having a structural formula of $Cr(H_nPO_4)_{(3/3-n)}$ wherein, n=1 to 2 is preferably used here since it provides durability under high temperature and high humidity, and particularly n is most preferably 1.

The zinc ion sources used in the finishing agent for a trivalent chromium film of the present invention include zinc oxide, zinc carbonate, zinc nitrate, zinc chloride, zinc sulfate, and zinc salts of various kinds of organic carboxylic acids, but zinc oxide and zinc carbonate are preferred. These zinc ion sources can be used alone or in combination of two or more. The concentration thereof is preferably 0.1 to 30 g/L, and more preferably 0.5 to 20 g/L based on the concentration of zinc.

The chelating agents capable of forming a complex with trivalent chromium used in the finishing agent for a trivalent chromium film of the present invention include: polyvalent carboxylic acids such as monocarboxylic acid, dicarboxylic acid, and tricarboxylic acid; hydroxycarboxylic acid; aminocarboxylic acid (for example, glycine); and their salts. Among these, oxalic acid, malonic acid, citric acid, tartaric acid, and malic acid are preferred. These chelating agents can be used alone or in combination of two or more. The concentration thereof is preferably 0.5 to 100 g/L, and more preferably 1 to 50 g/L in the aqueous solution.

The molar ratio of the chelating agent to trivalent chromium has an effect on corrosion resistance and finished appearance (treated appearance) and thus it is preferably 0.2 to 2. It is more preferably 0.5 to 1. The molar ratio of the chelating agent to zinc is preferably 0.5 or higher and more preferably 0.7 to 1.

The nonionic water-soluble polymer used in the finishing agent for a trivalent chromium film of the present invention is selected from the group consisting of polyvinyl alcohol and its derivatives, polyvinylpyrrolidone and its derivatives, polyalkylene glycol and its derivatives, and cellulose ether and its derivatives.

Polyvinyl alcohol and its derivatives include polyvinyl alcohol and sulfonic acid-modified polyvinyl alcohol. Examples thereof include, but are not limited to, PVA NL05, GM-13, and GOHSERAN L-3266, produced by The Nippon Synthetic Chemical Industry Co., Ltd.

Polyvinylpyrrolidone and its derivatives include polyvinylpyrrolidone and vinyl acetate-vinylpydolidone copolymers. Examples thereof include, but are not limited to, K-30, K-30W, and K-90, produced by Nippon Shokubai Co., Ltd.

Polyalkylene glycol and its derivatives include polyethylene glycol, polypropylene glycol, and their ether derivatives. Examples thereof include PEG-200, PEG-1000, and PEG-4000, produced by NOF CORPORATION, UNIOL D-700 and D-2000, produced by NOF CORPORATION, and UNIOL TG-1000 produced by NOF CORPORATION.

Cellulose ether and its derivatives include methyl cellulose, ethyl cellulose, hydroxyethyl cellulose, hydroxypropyl cellulose, and hydroxymethyl propyl cellulose. Examples thereof include, but are not limited to, Metolose SM, SH, SH types produced by Shin-Etsu Chemical Co., Ltd.

These nonionic water-soluble polymers can be used alone or in combination of two or more. The concentration of the nonionic water-soluble polymer is preferably 0.01 to 50 g/L, and more preferably 0.1 to 10 g/L. The concentration of over 50 g/L neither causes any performance problem nor has any further effect.

Addition of these nonionic water-soluble polymers particularly contributes to prevention of scratches, thereby improving the appearance as well as the corrosion resistance of the trivalent chromium chemical conversion coating film. The finishing agent for a trivalent chromium chemical conversion coating film of the present invention can form the hexavalent chromium-free corrosion resistant chemical conversion coating film, particularly the black trivalent chromium chemical conversion coating film, having low insulation as well as excellent gloss and corrosion resistance without any scratch while not losing fastening performance.

The stain-blocking agent used in the finishing agent for a trivalent chromium film of the present invention is selected from the group consisting of urea, thiourea, thiourea dioxide, and their derivatives.

Examples of urea, thiourea, thiourea dioxide, and their derivatives include compounds represented by the following general formula.

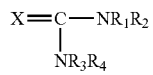

wherein, X represents for O, S, or $SO_2H$, $R_1$ to $R_4$ each independently represent a hydrogen atom, a chain hydrocarbon group, a cyclic hydrocarbon group, an aralkyl group, or an aryl group.

The chain hydrocarbon group of $R_1$ to $R_4$ is preferably a chain hydrocarbon group with 1 to 8 carbon atoms, and more preferably an alkyl group with 1 to 8 carbon atoms. Examples thereof include a methyl group, an ethyl group, a straight or branched propyl group, butyl group, and hexyl group.

The cyclic hydrocarbon group is preferably a cyclic hydrocarbon group with 3 to 8 carbon atoms, and more preferably a cyclic hydrocarbon group with 5 to 6 carbon atoms. Examples thereof include a cyclopentylic group and a cyclohexyl group.

The aralkyl groups preferably include a benzyl group and a phenethyl group. These phenyl groups may be substituted with an alkyl group and the like.

The aryl groups preferably include a phenyl group, a toluoyl group, and a lower alkoxyphenyl group.

It is more preferred that $R_1$ to $R_4$ each independently represent a hydrogen atom or an alkyl group with 1 to 3 carbon atoms.

Specific example of the stain-blocking agent include urea, N-methylurea, N-ethylurea, N-butylurea, N,N'-dimethylurea, phenylurea, benzylurea, ethoxyphenylurea, thiourea, N-methylthiourea, N-ethylthiourea, N,N'-dimethylthiourea, phenylthiourea, benzylthiourea, ethoxyphenylthiourea, thiourea dioxide, N-methylthiourea dioxide, and N-ethylthiourea dioxide.

These stain-blocking agents can be used alone or in combination of two or more. The concentration of the stain-blocking agent is preferably 0.01 to 30 g/L, and more preferably 0.1 to 15 g/L.

Addition of these stain-blocking agents particularly contributes to prevention of stains, especially prevention of green stains due to liquid accumulation, and further improves the corrosion resistance. The finishing agent for a trivalent chromium chemical conversion coating film of the present invention can form the hexavalent chromium-free corrosion resistant chemical conversion coating film, particularly the black trivalent chromium chemical conversion coating film, having low insulation as well as excellent gloss and corrosion resistance without any stain while not losing fastening performance.

Moreover, in the present invention, addition of the stain-blocking agent in combination with the nonionic water-soluble polymer can form the hexavalent chromium-free corrosion resistant chemical conversion coating film, particularly the black trivalent chromium chemical conversion coating film, having low insulation as well as excellent gloss and corrosion resistance with no scratches or stains while not losing fastening performance. When the stain-blocking agent is added in combination with the nonionic water-soluble polymer, each concentration is in the above range of the concentration and the total concentration is preferably 0.01 to 50 g/L and more preferably 0.1 to 15 g/L.

The finishing agent for a trivalent chromium film of the present invention preferably further contains an anti-mold component. The finishing agent containing the anti-mold component can suppress bacteria and can be used for a long time without mold growth. The anti-mold component is preferably an isothiazoline compound. The isothiazoline compound is preferably expressed by the following general formula.

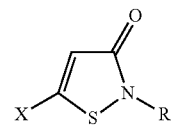

wherein, R represents an alkyl group with 1 to 8 carbon atoms, and X represents a hydrogen atom, a Cl atom, or a Br atom.

These anti-mold components can be used alone or in combination of two or more. The concentration of the anti-mold component is preferably 0.01 to 50 g/L, and more preferably 0.1 to 5 g/L. The concentration of over 50 g/L does not cause any performance problem, but is not preferred economically.

It is desirable that the finishing agent for a trivalent chromium film of the present invention further contains water and be in the form of an aqueous solution. In this case, the pH of the aqueous solution is preferably 2.5 to 8. It is more preferably 3 to 7 and most preferably 4 to 6. In order to adjust the pH in this range, alkaline agents such as alkali hydroxides, aqueous ammonia, and amines are preferably used.

It is desirable that the finishing agent for a trivalent chromium film of the present invention further contains metal ions selected from the group consisting of aluminum, silicon, molybdenum, manganese, and cobalt in order to improve the corrosion resistance of the film to be obtained. These kinds of metal ions can be used alone or in combination of two or more. The concentration thereof is preferably 0.1 to 30 g/L, and more preferably 0.5 to 5 g/L.

It is preferred to add the following surfactant and water-soluble resin to the finishing agent for a trivalent chromium film of the present invention since the appearance and the uniformity as well as the glossiness of the finished film can be improved.

The surfactants to be added include ether based nonionic surfactants, a polyoxyethylene-polyoxypropylene block-polymer, and polyoxyethylene nonylphenyl ether. The concentration thereof is preferably 0.01 to 100 g/L, and more preferably 1 to 50 g/L.

The water-soluble resins to be added include water-soluble acrylic resin, water-soluble urethane resin, water-soluble melamine resin, and emulsion type wax. The concentration thereof is preferably 0.01 to 100 g/L, and more preferably 1 to 50 g/L. It is preferred to set the pH of the finishing agent composition to 7 to 8 when the water-soluble resin is added.

Silicone can be also added in order to improve easy dripping of the finishing agent for a trivalent chromium film of the present invention and prevent stains due to drying. The concentration thereof is preferably 1 to 1000 ppm, and more preferably 10 to 100 ppm.

The finishing agent for a trivalent chromium film of the present invention is preferably free of halogen ions, sulfate ions, and sulfonic acid ions. This suppresses generation of white products at high temperature and high humidity.

The substrates used in the present invention include various shaped objects such as plate-like, rectangular parallelepiped, columnar, cylindrical, and spherical objects of different kinds of metal such as iron, nickel, and copper, and their alloys, or of metal such as aluminum and its alloys having zinc substitution. Among these, those made of zinc or zinc alloys, and those having a zinc or zinc alloy plating film on the surface are preferred. The zinc or zinc alloy plating film here can be easily formed by conventional methods.

For example, the zinc alloy plating film is desirably formed using either acidic baths such as a sulfuric acid bath, an ammonium bath, and a potassium bath or alkaline baths such as an alkaline non-cyanide bath and an alkaline cyanide bath. In particular, it is preferred to use an alkaline non-cyanide plating bath (NZ-98 bath or NZ-87 bath produced by Dipsol Chemicals Co., Ltd., or the like) here.

The zinc alloy plating includes zinc-iron alloy plating, zinc-nickel alloy plating, and zinc-cobalt alloy plating. The zinc or zinc alloy plating may have any thickness, preferably a thickness of 1 μm or more and more preferably 5 to 25 μm.

The substrate having the trivalent chromium chemical conversion coating film (preferably, the black trivalent chromium chemical conversion coating film) targeted for the present invention can be obtained by washing the above substrate, particularly the substrate having the zinc or zinc alloy plating layer with water, followed by trivalent chromium chemical conversion coating to form the trivalent chromium chemical conversion coating film.

The trivalent chromium chemical conversion coating film can be formed using various treatment solutions for trivalent chromium chemical conversion coating described in U.S. Pat. No. 5,415,702, JP-A No. 2003-166074, JP-A No. 2003-166075, and the like. It is preferred to use a treatment solution for black trivalent chromium chemical conversion coating described in WO 2003/076686, specifically a treatment solution for black trivalent chromium chemical conversion coating, in which the molar ratio ($NO_3^-/Cr^{3+}$) of nitrate ions and trivalent chromium is less than 0.5, trivalent chromium is present in the form of a water-soluble complex with the chelating agent, and cobalt ions and/or nickel ions are included, wherein the cobalt ions and/or nickel ions is stably present in the treating solution without forming insoluble metal salts with the chelating agent to precipitate and the treatment solution reacts with zinc to include zinc, chromium, and cobalt and/or nickel, and the chelating agent when brought into contact with the zinc and zinc alloy plating.

For example, a substrate having has a zinc or zinc alloy plating layer is preferably subjected to trivalent chromium chemical conversion coating by immersion in the treatment solution for trivalent chromium chemical conversion coating, for example, at 10° C. to 80° C., more preferably 40° C. to 60° C. for 5 to 600 seconds, more preferably 30 to 120 seconds.

The trivalent chromium chemical conversion coating film having a thickness of about 0.1 to 0.3 μm is desirably provided on the zinc or zinc alloy plating layer in this way.

In the present invention, the substrate having the trivalent chromium chemical conversion coating film, particularly the black trivalent chromium chemical conversion coating film is brought into contact with the finishing agent composition of the present invention in the form of an aqueous solution such that the trivalent chromium chemical conversion coating film contacts the finishing agent composition (preferably, immersed in the finishing agent composition) after washed with water or without washing with water to adhere to the finishing agent composition, followed by drying, preferably by dehydration and drying without washing with water to form the finishing layer on the trivalent chromium chemical conversion coating film.

The contact temperature (preferably, immersion temperature) is preferably 10° C. to 80° C., and more preferably 45° C. to 55° C.

The contact time (preferably, immersion time) is preferably 3 to 30 seconds, and more preferably 3 to 5 seconds.

The drying temperature is preferably 50° C. to 200° C., and more preferably 80° C. to 120° C.

The drying time is preferably 5 to 60 minutes, and more preferably 10 to 20 minutes.

This finishing treatment can form, on the trivalent chromium chemical conversion coating film, the finishing layer including trivalent chromium, zinc, and phosphorus elements, for example, 10 to 40 parts by weight of trivalent chromium, 20 to 75 parts by weight of zinc, and 3 to 40 parts by weight of phosphorus given that the total of trivalent chromium, zinc, and phosphorus elements is 100 parts by weight. The optimal weight ratio of trivalent chromium/zinc/phosphorus is (20 to 25)/(60 to 50)/(20 to 25). The total of trivalent chromium, zinc, and phosphorus element in the finishing layer is preferably 30% to 75% by weight.

The finishing layer has any thickness, preferably a thickness of about 0.05 to 0.3 μm.

Depending on the purpose of imparting lubricity or the like, overcoating can be performed on the trivalent chromium chemical conversion coating film of the present invention. As overcoats, inorganic films of silicate, phosphate, and the like; as well as organic films of polyethylene, polyvinyl chloride, polystyrene, polypropylene, metacrylate resin, polycarbonate, polyamide, polyacetal, fluororesin, urea resin, phenol resin, unsaturated polyester resin, polyurethane, alkyd resin, epoxy resin, melamine resin, and the like; silicone oils; waxes; anti-rust oils and the like are effective.

The present invention provides a metal article having the hexavalent chromium-free corrosion resistant film, including the metal substrate, the black trivalent chromium chemical conversion coating film provided thereon, and the finishing layer provided thereon.

This metal article can be suitably used as metal members such as screws and bolts, or metal products such as parts for automobiles.

The present invention will be next described in more detail with reference to Examples.

EXAMPLES

Example 1

An M8 bolt having 8 μm thick zinc plating obtained by zincate plating using an NZ-87 bath produced by Dipsol Chemicals Co., Ltd. was treated with ZTB-447S123C3 type black trivalent chromium chemical conversion coating agents (ZTB-447S1: 50 mL/L, ZTB-447S2: 20 mL/L, and ZTB-447S3: 7 mL/L) produced by Dipsol Chemicals Co., Ltd. (at 30° C. for 40 seconds) and subsequently immersed in the finishing agents shown in Table 1 at 50° C. for 5 seconds, followed by centrifugal dehydration and then drying at 120° C.

TABLE 1

| | No. 1 | 2 | 3 | 4 | 5 | 6 | 7 | 8 | 9 | 10 |
|---|---|---|---|---|---|---|---|---|---|---|
| $Cr^{3+}$ (g/L) | 5 | 5 | 10 | 5 | 5 | 5 | 5 | 10 | 5 | 5 |
| $Zn^{2+}$ (g/L) | 10 | 10 | 20 | 10 | 5 | 10 | 10 | 20 | 10 | 10 |
| $PO_4^-$ (g/L) | 15 | 15 | 30 | 30 | 15 | 15 | 12 | 30 | 15 | 15 |
| Oxalic acid (g/L) | | | | | 15 | | | | 24 | |
| Malonic acid (g/L) | | | | | 15 | | | 24 | | |
| Citric acid (g/L) | 25 | 25 | 50 | 25 | | 25 | 25 | | | 25 |
| PVA NL05 (g/L) | 0.5 | | | | 0.5 | 0.5 | | | | |
| PVA GM14 (g/L) | | | | 0.5 | | | | 0.5 | 0.5 | 0.5 |
| GOHSERAN L3266 (g/L) | | 0.5 | | | | | 0.5 | | | |
| Urea (g/L) | | 5 | | 5 | | | | 5 | | |
| Thiourea (g/L) | 5 | | | | | 5 | | | | 5 |
| Thiourea Dioxide (g/L) | | | 5 | | 5 | | | 5 | | |
| Isothiazoline (g/L) | | 0.25 | 0.25 | 0.25 | 0.25 | 0.25 | 0.25 | 0.25 | 0.25 | |
| Additional Metal Ions | | | | | $Co^{2+}$ | $Co^{2+}$ | $Co^{2+}$ $Si^{4+}$ | $Co^{2+}$ $Al^{3+}$ | $Co^{2+}$ | |
| Other Additives | | | | | Surfactant | | | | Silicone | Acrylic Resin |
| pH of Treatment Solution | 3.0 | 5.0 | 4.0 | 5.0 | 4.0 | 4.0 | 5.0 | 4.0 | 4.0 | 7.5 |

In Table 1, chromium phosphate was used for $Cr^{3+}$. Zinc oxide was used for $Zn^{2+}$. ZONEN-C produced by Chemicrea Inc. was used as isothiazoline. Colloidal silica was used for $Si^{4+}$. Cobalt carbonate (No. 5, 6, 7 and 8) or cobalt nitrate (No. 9) was used for $Co^{2+}$. Aluminum phosphate was used for $Al^{3+}$. The concentration of additional metal ions was 1 g/L. The pH was adjusted with caustic soda (No. 1, 3, 5, 6, 7 and 10) or aqueous ammonia (No. 2, 4, 8 and 9). Twenty g/L of ether nonionic surfactant "SEDORAN FF200" (produced by Sanyo Chemical Industries, Ltd.) was used as the surfactant, 10 ppm of L-720 produced by Dow Corning Toray Co., Ltd. was used as silicone, and 30 g/L of AQUALIC L series DL produced by Nippon Shokubai Co., Ltd. Co., Ltd. was used as the acrylic resin. The balance is water.

Example 2

An M8 bolt having 8 μm thick iron alloy plating (Fe: 0.5% by weight) was treated with a black trivalent chromium chemical conversion coating agent (ZTB-447A (200 mL/L) and ZTB-447K (8 mL/L) produced by Dipsol Chemicals Co., Ltd.) (at 50° C. for 60 seconds) and subsequently immersed in the finishing agents shown in Table 2 at 50° C. for 5 seconds, followed by centrifugal dehydration and then drying at 120° C.

TABLE 2

| | No. 1 | 2 | 3 | 4 |
|---|---|---|---|---|
| $Cr^{3+}$ (g/L) | 5 | 10 | 5 | 5 |
| $Zn^{2+}$ (g/L) | 10 | 20 | 10 | 5 |
| $PO_4^-$ (g/L) | 15 | 30 | 30 | 15 |
| Oxalic acid (g/L) | | | | 15 |
| Malonic acid (g/L) | | | | 15 |
| Citric acid (g/L) | 25 | 50 | 25 | |
| PVA NL05 (g/L) | 0.5 | | 0.5 | 0.5 |
| PVA GM14 (g/L) | | | | |
| GOHSERAN L3266 (g/L) | | 0.5 | | |
| Urea (g/L) | 5 | | 5 | |
| Thiourea (g/L) | | 5 | | 5 |
| Thiourea Dioxide (g/L) | | | | |
| Isothiazoline (g/L) | | 0.25 | 0.25 | 0.25 |
| Additional Metal Ions | | | | $Co^{2+}$ |
| Other Additives | | | | Surfactant |
| pH of Treatment Solution | 4.0 | 4.0 | 4.0 | 4.0 |

In Table 2, chromium phosphate was used for $Cr^{3+}$. Zinc oxide was used for $Zn^{2+}$. ZONEN-C produced by Chemicrea Inc. was used as isothiazoline. The cobalt nitrate was used for $Co^{2+}$. The concentration of additional metal ions was 1 g/L. The pH was adjusted with caustic soda (No. 1, 2, and 4) or aqueous ammonia (No. 3). Twenty g/L of ether nonionic surfactant "SEDORAN FF200" (produced by Sanyo Chemical Industries, Ltd.) was used as the surfactant. The balance is water.

Example 3

An M8 bolt having 8 μm thick zinc nickel alloy plating (Ni: 15% by weight) was treated with black trivalent chromium chemical conversion coating agent IZB-256 (IZB-256AY: 150 mL/L and IZB-256BY: 50 mL/L) produced by Dipsol Chemicals Co., Ltd. (at 25° C. for 45 seconds) and subsequently immersed in the finishing agents shown in Table 3 at 50° C. for 5 seconds, followed by centrifugal dehydration and then drying at 120° C.

TABLE 3

|  | No. | | | |
|---|---|---|---|---|
|  | 1 | 2 | 3 | 4 |
| $Cr^{3+}$ (g/L) | 5 | 10 | 5 | 5 |
| $Zn^{2+}$ (g/L) | 10 | 20 | 10 | 5 |
| $PO_4^-$ (g/L) | 15 | 30 | 30 | 15 |
| Oxalic acid (g/L) |  |  |  | 15 |
| Malonic acid (g/L) |  |  |  | 15 |
| Citric acid (g/L) | 25 | 50 | 25 |  |
| PVA NL05 (g/L) | 0.5 |  | 0.5 | 0.5 |
| PVA GM14 (g/L) |  |  |  |  |
| GOHSERAN L3266 (g/L) |  | 0.5 |  |  |
| Urea (g/L) | 5 |  | 5 |  |
| Thiourea (g/L) |  | 5 |  | 5 |
| Thiourea Dioxide (g/L) |  |  |  |  |
| Isothiazoline (g/L) |  | 0.25 | 0.25 | 0.25 |
| Additional Metal Ions |  |  |  | $Co^{2+}$ |
| Other Additives |  |  |  | Surfactant |
| pH of Treatment Solution | 4.0 | 4.0 | 4.0 | 5.0 |

In Table 3, chromium phosphate was used for $Cr^{3+}$. Zinc oxide was used for $Zn^{2+}$. ZONEN-C produced by Chemicrea Inc. was used as isothiazoline. The cobalt nitrate was used for $Co^{2+}$. The concentration of additional metal ions was 1 g/L. The pH was adjusted with caustic soda (No. 1, 2, and 4) or aqueous ammonia (No. 3). Twenty g/L of ether nonionic surfactant "SEDORAN FF200" (produced by Sanyo Chemical Industries, Ltd.) was used as the surfactant. The balance is water.

Comparative Example 1

As Comparative Example, an M8 bolt having 8 μm thick zinc plating, as in Example 1, was treated with black hexavalent chromate at 25° C. for 60 seconds.

ZB-535A (200 ml/L) and ZB-black 50B (10 ml/L) produced by Dipsol Chemicals Co., Ltd. were used as black hexavalent chromate.

Comparative Example 2

As Comparative Example, an M8 bolt having 8 μm thick zinc plating was treated with black trivalent chromate and then finished with the finishing agents described in Table 4 which were the finishing agents of No. 1 to 4 in Example 1 without polyvinyl alcohol, the stain-blocking agent, and the anti-mold component. ZTB-447A (200 mL/L) and ZTB-447K (8 mL/L) produced by Dipsol Chemicals Co., Ltd. were used for black trivalent chromium chemical conversion coating (treatment conditions: at 50° C. for 60 seconds.)

TABLE 4

|  | No. | | | |
|---|---|---|---|---|
|  | 1 | 2 | 3 | 4 |
| $Cr^{3+}$ (g/L) | 5 | 10 | 5 | 5 |
| $Zn^{2+}$ (g/L) | 10 | 20 | 10 | 5 |
| $PO_4^-$ (g/L) | 15 | 30 | 30 | 15 |
| Oxalic acid (g/L) |  |  |  | 15 |
| Malonic acid (g/L) |  |  |  | 15 |
| Citric acid (g/L) | 25 | 50 | 25 |  |
| PVA NL05 (g/L) |  |  |  |  |
| PVA GM14 (g/L) |  |  |  |  |
| GOHSERAN L3266 (g/L) |  |  |  |  |
| Urea (g/L) |  |  |  |  |
| Thiourea (g/L) |  |  |  |  |
| Thiourea Dioxide (g/L) |  |  |  |  |
| Isothiazoline (g/L) |  |  |  |  |
| Additional Metal Ions |  |  |  | $Co^{2+}$ |
| Other Additives |  |  |  | Surfactant |
| pH of Treatment Solution | 4.0 | 4.0 | 4.0 | 5.0 |

In Table 3, chromium phosphate was used for $Cr^{3+}$. Zinc oxide was used for $Zn^{2+}$. Cobalt carbonate was used for $Co^{2+}$. The concentration of metal ions was 1 g/L. The pH was adjusted with caustic soda (No. 1, 2, and 4) or aqueous ammonia (No. 3). Twenty g/L of ether nonionic surfactant "SEDORAN FF200" (produced by Sanyo Chemical Industries, Ltd.) was used as the surfactant. The balance is water.

For the chemical conversion coating films obtained in Examples 1 to 3 and Comparative Examples 1 and 2, the treated appearance, the result of the salt spray test, and the mold growth state of the finishing agent left at room temperature for one month are summarized in Table 5.

As shown in Table 5, the films of No. 1, and No. 3 to 10 in Example 1 including polyvinyl alcohol had glossy appearance with less scratches and good corrosion resistance as compared with the films of No. 1, 3, and 4 in Comparative Example 2 without polyvinyl alcohol. The films of No. 1 to 4 in Examples 2 and 3 also had glossy appearance with less scratches and accumulated stains and more excellent corrosion resistance.

Regarding the mold growth status of the finishing agents left at room temperature for one month, mold was grown in all finishing agents of No. 1 to 4 in Comparative Example 2 without the anti-mold component, but no mold growth was observed in the finishing agents of No. 3 to 10 in Example 1 and No. 2 to 4 in Examples 2 and 3 containing the anti-mold component.

TABLE 5

| No. | Corrosion Resistance Salt Spray Test (Time Until White Rust Occurs) (Hrs) | Mold Growth Status at Room Temperature in One Month | Treated appearance |
|---|---|---|---|
| Ex. 1-1 | 168 | + (with growth) | Glossy black with stains and no scratches |
| Ex. 1-2 | 144 | + | Glossy black with scratches and no stains |
| Ex. 1-3 | 168 | − (no growth) | Glossy black without scratches or stains |
| Ex. 1-4 | 168 | − | Glossy black without scratches or stains |
| Ex. 1-5 | 168 | − | Glossy black without scratches or stains |
| Ex. 1-6 | 168 | − | Glossy black without scratches or stains |
| Ex. 1-7 | 168 | − | Glossy black without scratches or stains |
| Ex. 1-8 | 168 | − | Glossy black without scratches or stains |
| Ex. 1-9 | 168 | − | Glossy black without scratches or stains |
| Ex. 1-10 | 168 | + | Glossy black without scratches or stains |
| Ex. 2-1 | 192 | + | Glossy black without scratches or stains |
| Ex. 2-2 | 192 | − | Glossy black without scratches or stains |
| Ex. 2-3 | 192 | − | Glossy black without scratches or stains |
| Ex. 2-4 | 192 | − | Glossy black without scratches or stains |
| Ex. 3-1 | 240 | + | Glossy black without scratches or stains |
| Ex. 3-2 | 240 | − | Glossy black without scratches or stains |
| Ex. 3-3 | 240 | − | Glossy black without scratches or stains |
| Ex. 3-4 | 240 | − | Glossy black without scratches or stains |
| Comp. Ex. 1 | 96 | − | Glossy black without scratches |
| Comp. Ex. 2-1 | 120 | + | Glossy black with scratches and stains |
| Comp. Ex. 2-2 | 120 | + | Glossy black with scratches and stains |
| Comp. Ex. 2-3 | 120 | + | Glossy black with scratches and stains |
| Comp. Ex. 2-4 | 120 | + | Glossy black with scratches and stains |

(Method for Corrosion Resistance Test)

The salt spray test according to JIS 22371 was performed and evaluated based on the time until white rust occurs.

(Method for Mold Growth Test and Evaluation)

The finishing agents were naturally left at room temperature for one month and visually determined on whether there was the "growth or no growth" of mold.

(Method for Evaluating Treated Appearance)
(Method for Scratch Test and Evaluation)

Seventy flange bolts of M10×60 mm treated in the same manners as in Examples 1 to 3 and Comparative Examples 1 and 2 were dropped from a height of 1 m above 3 times and visually determined on whether there were "scratches or no scratches".

(Method for Stain Test and Evaluation)

Recessed head bolts were subjected to trivalent black conversion coating and then the finishing agents was dropped on the heads thereof to make liquid accumulation. They were left to dry at 80° C. for 10 minutes and visually determined on where there were "stains or no stains".

(Method for Glossy Test and Evaluation)

Treated products were visually determined on its appearance color and gloss, for example, as glossy black for black with gloss.

The invention claimed is:

1. A finishing agent for a trivalent chromium chemical conversion coating film, comprising:
    a trivalent chromium source;
    a phosphate ion source;
    a zinc ion source;
    a chelating agent capable of forming a complex with trivalent chromium;
    a stain-blocking agent selected from urea, thiourea, thiourea dioxide, and their derivatives; and
    a nonionic water-soluble polymer selected from the group consisting of polyvinyl alcohol and its derivatives, polyvinylpyrrolidone and its derivatives, polyalkylene glycol and its derivatives, and cellulose ether and its derivatives.

2. The finishing agent for a trivalent chromium chemical conversion coating film according to claim 1, wherein the nonionic water-soluble polymer is polyvinyl alcohol or sulfonic acid-modified polyvinyl alcohol.

3. The finishing agent for a trivalent chromium chemical conversion coating film according to claim 1, further comprising an anti-mold component.

4. The finishing agent according to claim 1, wherein the phosphate ion source is oxygen acid of phosphorus or its salt.

5. The finishing agent for a trivalent chromium chemical conversion coating film according to claim 1, wherein the trivalent chromium source and the phosphate ion source are chromium phosphate.

6. The finishing agent for a trivalent chromium chemical conversion coating film according to claim 1, wherein the chelating agent is selected from the group consisting of monocarboxylic acids, dicarboxylic acids, tricarboxylic acids, hydroxycarboxylic acids, aminocarboxylic acids, and their salts.

7. The finishing agent for a trivalent chromium chemical conversion coating film according to claim 6, wherein the chelating agent is selected from the group consisting of oxalic acid, malonic acid, citric acid, tartaric acid, and malic acid.

8. The finishing agent for a trivalent chromium chemical conversion coating film according to claim 3, wherein the anti-mold component is an isothiazoline compound.

9. A finishing agent for a trivalent chromium chemical conversion coating film, comprising a trivalent chromium complex, phosphoric acid ions, zinc ions, a nonionic water-soluble polymer, and water, and comprising a stain blocking agent, and being in the form of an aqueous solution,
    wherein the nonionic water-soluble polymer is selected from the group consisting of polyvinyl alcohol and its derivatives, polyvinylpyrrolidone and its derivatives, polyalkylene glycol and its derivatives, and cellulose ether and its derivatives, and the stain-blocking agent is selected from urea, thiourea, thiourea dioxide and their derivatives.

10. The finishing agent for a trivalent chromium chemical conversion coating film according to claim 9, wherein the pH ranges from 2.5 to 8.

11. The finishing agent for a trivalent chromium chemical conversion coating film according to claim 1, further comprising metal ions selected from the group consisting of aluminum, silicon, molybdenum, manganese, and cobalt.

12. The finishing agent for a trivalent chromium chemical conversion coating film according to claim 1, further comprising a surfactant.

13. The finishing agent for a trivalent chromium chemical conversion coating film according to claim 1, being free of halogen ions, sulfate ions, and sulfonic acid ions.

14. The finishing agent for a trivalent chromium chemical conversion coating film according to claim 1, comprising a weight ratio of trivalent chromium, zinc, and phosphorus as follows: 10 to 40 parts by weight of trivalent chromium, 20 to 75 parts by weight of zinc and 3 to 40 parts by weight of phosphorus given that the total of trivalent chromium, zinc, and phosphorus element is 100 parts by weight.

* * * * *